United States Patent
Huang et al.

(10) Patent No.: US 9,847,392 B1
(45) Date of Patent: Dec. 19, 2017

(54) SEMICONDUCTOR DEVICE AND METHOD FOR FABRICATING THE SAME

(71) Applicant: UNITED MICROELECTRONICS CORP., Hsin-Chu (TW)

(72) Inventors: Yi-Ping Huang, New Taipei (TW); Yu-Jen Liu, Kaohsiung (TW); Hsin-Kai Chiang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/291,058

(22) Filed: Oct. 11, 2016

(51) Int. Cl.
| H01L 21/336 | (2006.01) |
| H01L 29/10 | (2006.01) |
| H01L 29/06 | (2006.01) |
| H01L 29/08 | (2006.01) |
| H01L 29/165 | (2006.01) |
| H01L 29/16 | (2006.01) |
| H01L 29/78 | (2006.01) |
| H01L 29/66 | (2006.01) |

(52) U.S. Cl.
CPC ...... *H01L 29/1083* (2013.01); *H01L 29/0653* (2013.01); *H01L 29/0847* (2013.01); *H01L 29/16* (2013.01); *H01L 29/165* (2013.01); *H01L 29/1608* (2013.01); *H01L 29/66537* (2013.01); *H01L 29/66545* (2013.01); *H01L 29/66636* (2013.01); *H01L 29/66795* (2013.01); *H01L 29/7843* (2013.01)

(58) Field of Classification Search
CPC ......... H01L 21/823431; H01L 29/1083; H01L 29/0653; H01L 29/0847; H01L 29/16; H01L 29/1608; H01L 29/165; H01L 29/66537; H01L 29/66545; H01L 29/66636; H01L 29/66795; H01L 29/7843
See application file for complete search history.

(56) References Cited

U.S. PATENT DOCUMENTS

| 9,508,834 B1 * | 11/2016 | Lee ................ H01L 29/66818 |
| 2005/0224800 A1 * | 10/2005 | Lindert ............ H01L 29/66795 257/66 |
| 2007/0238273 A1 * | 10/2007 | Doyle ............... H01L 21/26586 438/525 |

(Continued)

OTHER PUBLICATIONS

Sadao Adachi, "Optical Constants of Crystalline and Amorphous Semiconductors", p. 94, Copyright 1999, Print ISBN 978-0-7923-8567-7 , Online ISBN 978-1-4615-5247-5 , Publisher Springer US Copyright Holder Springer Science+Business Media New York.*

(Continued)

*Primary Examiner* — Sitaramaro S Yechuri
(74) *Attorney, Agent, or Firm* — Winston Hsu

(57) ABSTRACT

A method for fabricating semiconductor device is disclosed. The method includes the steps of: providing a substrate; forming a fin-shaped structure on the substrate; forming a shallow trench isolation (STI) around the fin-shaped structure; forming a gate structure on the fin-shaped structure and the STI and the fin-shaped structure directly under the gate structure includes a first epitaxial layer; forming a source region having first conductive type adjacent to one side of the gate structure; and forming a first drain region having a second conductive type adjacent to another side of the gate structure.

18 Claims, 6 Drawing Sheets

(56) References Cited

U.S. PATENT DOCUMENTS

| | | | | |
|---|---|---|---|---|
| 2008/0142841 A1* | 6/2008 | Lindert | ............. | H01L 29/66795 257/190 |
| 2011/0049613 A1* | 3/2011 | Yeh | ................... | H01L 29/66795 257/327 |
| 2012/0326239 A1* | 12/2012 | Sasaki | ................ | H01L 27/1108 257/369 |
| 2013/0264643 A1* | 10/2013 | Lee | ................... | H01L 29/66795 257/347 |
| 2013/0288448 A1* | 10/2013 | Liao | ................. | H01L 21/76224 438/424 |
| 2014/0061808 A1* | 3/2014 | Nakatsuka | ............ | G11C 11/412 257/368 |
| 2014/0332920 A1* | 11/2014 | Liou | ................ | H01L 21/76235 257/506 |
| 2015/0206759 A1* | 7/2015 | Tsao | ................... | H01L 29/0653 257/506 |
| 2015/0364593 A1* | 12/2015 | Jangjian | ............... | H01L 29/785 257/401 |

OTHER PUBLICATIONS

Chen, Title of Invention: Tunneling Transistor and Method of Fabrication the Same, U.S. Appl. No. 15/213,370, filed Jul. 18, 2016.

Yoonmyung Lee et al., Title: Low-Power Circuit Analysis and Design Based on Heterojunction Tunneling Transistors (HETTs), IEEE Transactions on Very Large Scale Integration (VLSI) Systems, vol. 21, No. 9, Sep. 2013.

\* cited by examiner

US 9,847,392 B1

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of fabricating semiconductor device having source region and drain region with different conductive type.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However, the overall architecture of fin-shaped structure still poses numerous problems in current FinFET fabrication, which not only affects the carrier mobility in the channel region but also influences overall performance of the device. Hence, how to improve the current FinFET process has become an important task in this field.

SUMMARY OF THE INVENTION

According to a preferred embodiment of the present invention, a method for fabricating semiconductor device is disclosed. The method includes the steps of: providing a substrate; forming a fin-shaped structure on the substrate; forming a shallow trench isolation (STI) around the fin-shaped structure; forming a gate structure on the fin-shaped structure and the STI, in which the fin-shaped structure directly under the gate structure includes a first epitaxial layer; forming a source region having first conductive type adjacent to one side of the gate structure; and forming a first drain region having a second conductive type adjacent to another side of the gate structure.

According to another aspect of the present invention, a semiconductor device is disclosed. The semiconductor device includes: a substrate; a fin-shaped structure on the substrate; a shallow trench isolation (STI) around the fin-shaped structure; a gate structure on the fin-shaped structure and the STI, in which the fin-shaped structure directly under the gate structure includes a first epitaxial layer; a source region having first conductive type adjacent to one side of the gate structure; and a drain region having second conductive type adjacent to another side of the gate structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
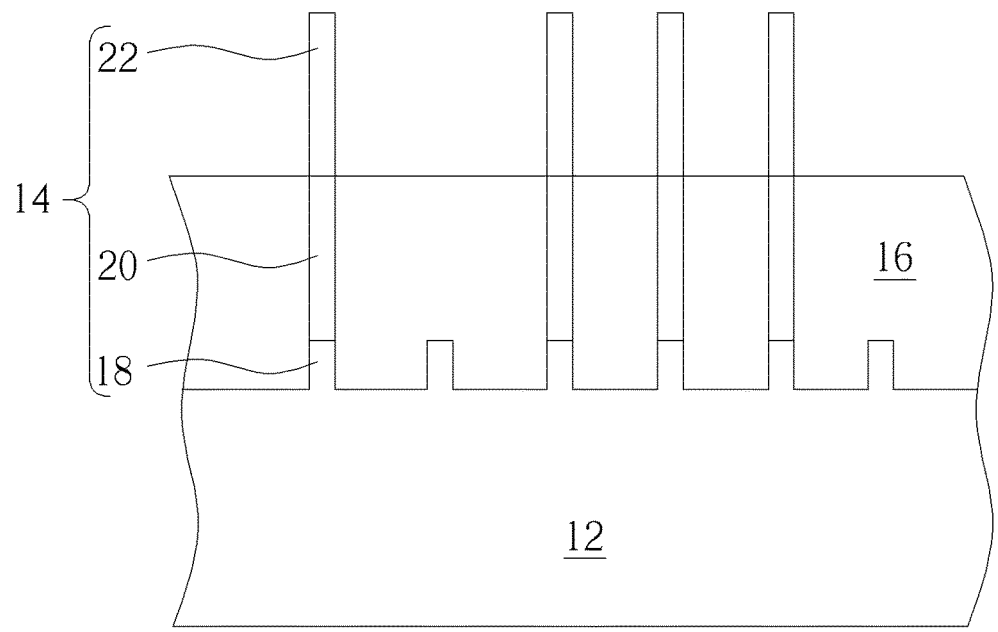
FIGS. 1-2 illustrate a method for fabricating a tunneling field effect transistor (TFET) according to an embodiment of the present invention.
Figure 2:
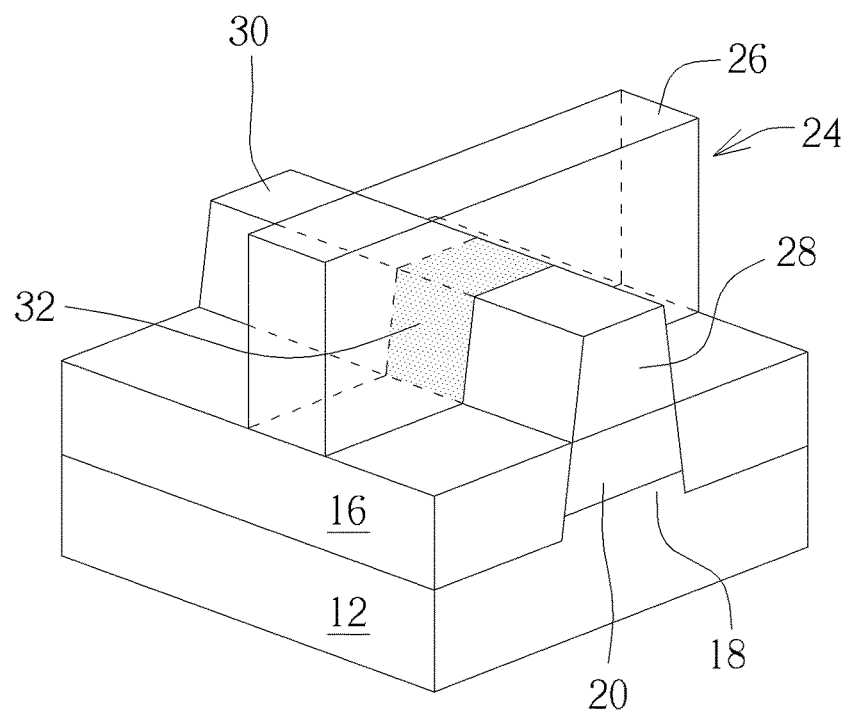

Referring to FIGS. 1-2, FIGS. 1-2 illustrate a method for fabricating a tunneling field effect transistor (TFET) according to an embodiment of the present invention. Preferably, FIG. 1 illustrates a cross-section view for fabricating a TFET and FIG. 2 illustrates a 3-dimensional view for fabricating the TFET following FIG. 1. As shown in FIGS. 1-2, a substrate 12, such as a silicon substrate or silicon-on-insulator (SOI) substrate is first provided, fin-shaped structures 14 are formed on the substrate 12, and a shallow trench isolation (STI) 16 composed of material such as silicon oxide is formed around the fin-shaped structures.

In this embodiment, each of the fin-shaped structures 14 includes three portions 18, 20, 22, in which the bottom portion 18 and the middle portion 20 are embedded under a top surface of the STI 16 while the top portion 22 is protruding from the top surface of the STI 16. Preferably, the bottom portion 18 and the substrate 12 are made of same material such as silicon, the middle portion 20 is made of silicon containing n-type or p-type dopants injected through an anti-punch through (APT) process, and the top portion 22 is made of epitaxial material including but not limited to for example, germanium (Ge) and/or silicon germanium (SiGe). It should be noted that the top portion 22 protruding from the top surface of the STI 16, in particular the part of top portion 22 covered by a gate structure in the later process will be serving as a channel region or channel region of the device.

According to an embodiment of the present invention, the fin-shaped structures 14 are obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures 14 could also be obtained by first forming a patterned mask (not shown) on the substrate 12, and through an etching process, the pattern of the patterned mask is transferred to the substrate 12 to form the fin-shaped structure 14. Moreover, the formation of the fin-shaped structures 14 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structures 14. These approaches for forming fin-shaped structures are all within the scope of the present invention.

Next, as shown in FIG. 2, at least agate structure 24 is formed on the substrate 12 and STI 16 and standing astride at least one of the fin-shaped structures 14. It should be noted that only a single gate structure 24 disposed across a single fin-shaped structure 14 is shown in FIG. 2 for emphasizing the formation of source region and drain region with respect to the gate structure 24 in the later process. The fabrication of the gate structure 24 could be accomplished by a gate first process, a high-k first approach from gate last process, or a high-k last approach from gate last process. Since this embodiment pertains to a high-k last approach, dummy gate or gate structure 24 composed of an interfacial layer (not shown) and a patterned polysilicon material layer 26 could be first formed on the fin-shaped structures 14 and the STI 16, and a spacer (not shown) is formed on the sidewall of the gate structure 24.

Next, a first ion implantation process is conducted to implant dopants of a first conductive type into the top portion 22 of fin-shaped structure 14 on one side of the gate structure 24 for forming a source region 28. After that, a second ion implantation is conducted to implant dopants of a second conductive type into the top portion 22 of fin-shaped structure 14 on another side of the gate structure 24 for forming a drain region 30. In this embodiment, the first conductive type is p-type and the source region 28 is implanted with p-type dopants while the second conductive type is n-type and the drain region 30 is implanted with n-type dopants. Nevertheless, it would also be desirable to reverse the order and/or conductive type of the first ion implantation process and second ion implantation process by first implanting n-type dopants for forming a source region and then implanting p-type dopants for forming a drain region, which is also within the scope of the present invention.

It should also be noted that after the source region 28 and the drain region 30 are formed, the source region 28, a channel region 32 or top portion 22 of fin-shaped structure 14 directly under the gate structure 24, and the drain region 30 are in a way made of three different materials. For instance, the source region 28 adjacent to one side of the gate structure 24 preferably includes Ge or SiGe with p-type dopants, the channel region 32 or top portion 22 of fin-shaped structure 14 directly under the gate structure 24 includes Ge or SiGe having no dopants, and the drain region 30 includes Ge or SiGe with n-type dopants.

Moreover, according to an embodiment of the present invention, the ratio of germanium to silicon (Ge/Si) could also be adjusted to form a gradient channel from the source region 28, through the channel region 32 directly under the gate structure 24, and to the drain region 30. For instance, the Ge/Si ratio in this embodiment is preferably adjusted so that the Ge/Si ratio gradually decreases from the source region 28 to the drain region 30. By doing so, the band gap would be increased from the source region 28 to the drain region 30 which would further in turn suppress ambipolar issue so that better driving current could be obtained.

Figure 3:
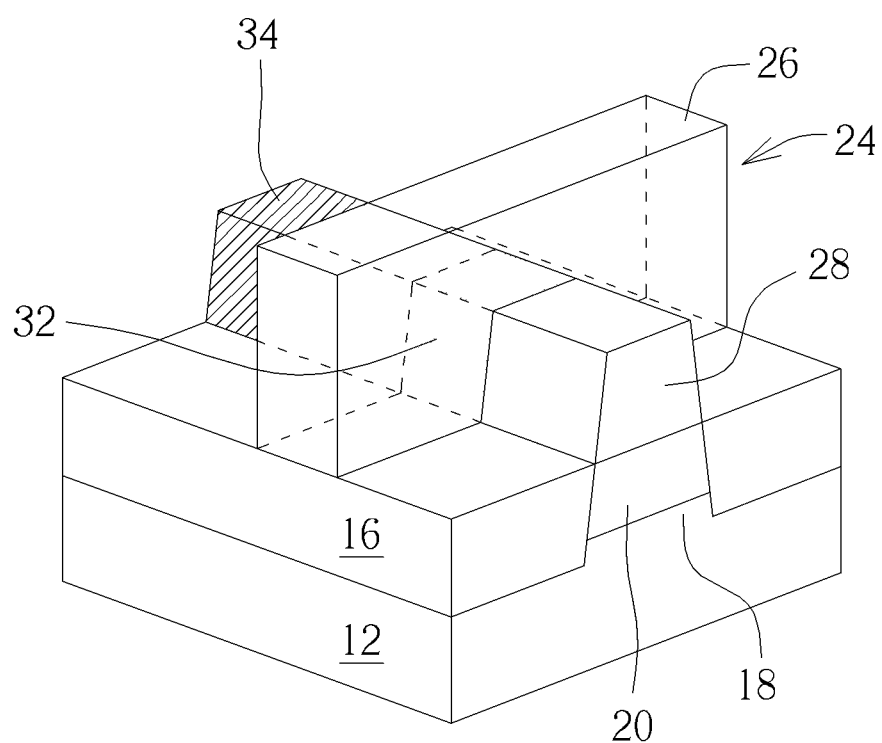
FIG. 3 illustrates a structural view of a TFET according to an embodiment of the present invention.

Referring to FIG. 3, FIG. 3 illustrates a structural view of a TFET according to an embodiment of the present invention. As shown in FIG. 3, after forming the source region 28 and drain region 30 having different conductive type as disclosed in FIG. 2, an etching process could be conducted to remove the drain region 30 made of Ge or SiGe on one side of the gate structure 24 and expose the middle portion 20 made of doped silicon underneath, and then grow another epitaxial layer 34 with in-situ n-type dopants through epitaxial growth process on the exposed middle portion 20.

Preferably, the newly grown epitaxial layer 34 (or the new drain region) and the channel region 32 directly under the gate structure 24 are made of different material, and the new drain region 34 and the source region 28 are also made of different material. For instance, the new drain region 34 in this embodiment is preferably made of silicon or silicon carbide (SiC) with in-situ n-type dopants while the channel region 32 is made of Ge or SiGe and the source region 28 is made of Ge or SiGe with p-type dopants.

After forming the source region 28 and either the drain region 30 formed in FIG. 2 or the drain region 34 formed in FIG. 3, a selective contact etch stop layer (CESL) (not shown) could be formed on source region 28, the drain region 30 or drain region 34, and the gate structure 24, and an interlayer dielectric (ILD) layer made of material such as tetraethyl orthosilicate (TEOS) is formed on the CESL. Next, a replacement metal gate (RMG) process could be conducted to planarize part of the ILD layer and then transforming the gate structure 24 into metal gate. The RMG process could be accomplished by first performing a selective dry etching or wet etching process, such as using etchants including ammonium hydroxide ($NH_4OH$) or tetramethylammonium hydroxide (TMAH) to remove the polysilicon material layer 26 for forming a recess (not shown) in the ILD layer. Next, a U-shaped high-k dielectric layer and a conductive layer including at least a U-shaped work function metal layer and a low resistance metal layer are formed in the recess, and a planarizing process is conducted thereafter so that the top surfaces of the U-shaped high-k dielectric layer, U-shaped work function metal layer and low resistance metal layer are even with the surface of the ILD layer.

Preferably, the work function metal layer is formed for tuning the work function of the later formed metal gates to be appropriate in an NMOS or a PMOS. For an NMOS transistor, the work function metal layer having a work function ranging between 3.9 eV and 4.3 eV may include titanium aluminide (TiAl), zirconium aluminide (ZrAl), tungsten aluminide (WA1), tantalum aluminide (TaAl), hafnium aluminide (HfAl), or titanium aluminum carbide (TiAlC), but it is not limited thereto. For a PMOS transistor, the work function metal layer having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer and the low resistance metal layer, in which the material of the barrier layer may include titanium (Ti), titanium nitride (TiN), tantalum (Ta) or tantalum nitride (TaN). Furthermore, the material of the low-resistance metal layer may include copper (Cu), aluminum (Al), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity.

Figure 4:
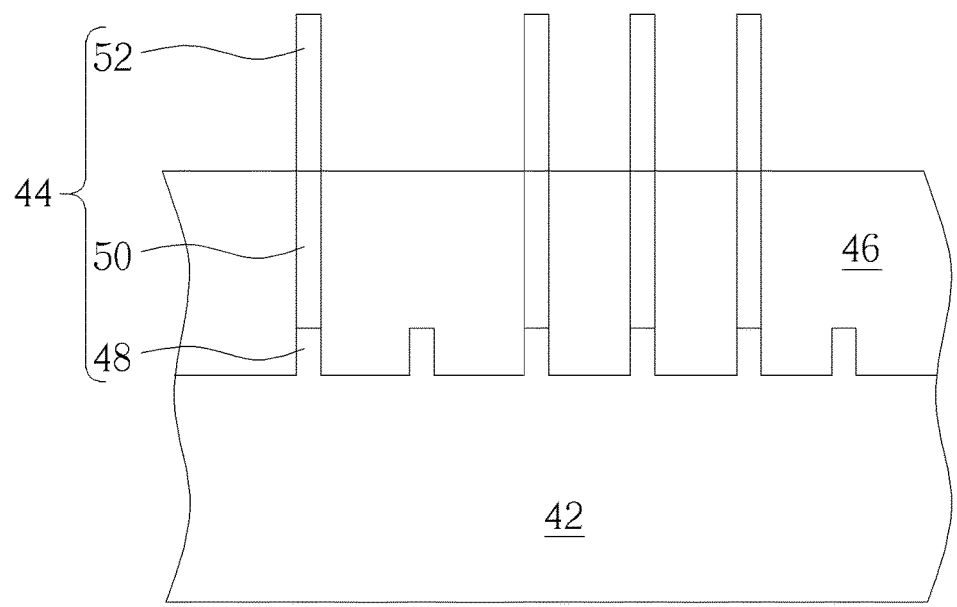
FIGS. 4-5 illustrate a method for fabricating a tunneling field effect transistor (TFET) according to an embodiment of the present invention.
Figure 5:
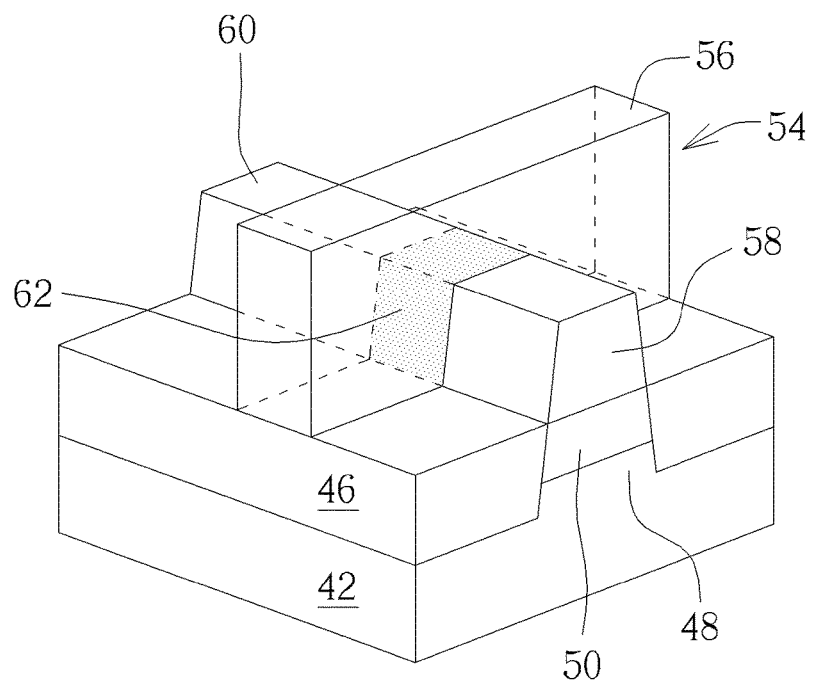

Referring to FIGS. 4-5, FIGS. 4-5 illustrate a method for fabricating a tunneling field effect transistor (TFET) according to an embodiment of the present invention. Preferably, FIG. 4 illustrates a cross-section view for fabricating a TFET and FIG. 5 illustrates a 3-dimensional view for fabricating the TFET following FIG. 4. As shown in FIGS. 4-5, a substrate 42, such as a silicon substrate or silicon-on-insulator (SOI) substrate is first provided, fin-shaped structures 44 are formed on the substrate 42, and a shallow trench isolation (STI) 46 composed of material such as silicon oxide is formed around the fin-shaped structures 44.

In this embodiment, each of the fin-shaped structures 44 includes three portions 48, 50, 52, in which the bottom portion 48 and the middle portion 50 are embedded under a top surface of the STI 46 while the top portion 52 is protruding from the top surface of the STI 46. Preferably, the bottom portion 48 and the substrate 12 are made of same material such as silicon, the middle portion 50 is made of dielectric material such as silicon oxide, and the top portion 52 is made of epitaxial material including but not limited to for example, germanium (Ge) and/or silicon germanium (SiGe). It should be noted that the top portion 52 protruding from the top surface of the STI 46, in particular the part of top portion 52 covered by a gate structure in the later process will be serving as a channel region or channel layer of the device.

Next, as shown in FIG. 5, at least a gate structure 54 is formed on the substrate 12 and STI 46 and standing astride at least one of the fin-shaped structures 44. It should be noted that only a single gate structure 54 disposed across a single fin-shaped structure 44 is shown in FIG. 5 for emphasizing the formation of source region and drain region with respect to the gate structure 54 in the later process. The fabrication of the gate structure 54 could be accomplished by a gate first process, a high-k first approach from gate last process, or a high-k last approach from gate last process. Since this embodiment pertains to a high-k last approach, dummy gate or gate structure 54 composed of an interfacial layer (not shown) and a patterned polysilicon material layer 56 could be first formed on the fin-shaped structure 44 and the STI 46, and a spacer (not shown) is formed on the sidewall of the gate structure 54.

Next, a first ion implantation process is conducted to implant dopants of a first conductive type into the top portion 52 of fin-shaped structure 44 on one side of the gate structure 54 for forming a source region 58. After that, a second ion implantation is conducted to implant dopants of a second conductive type into the top portion 52 of fin-shaped structure 44 on another side of the gate structure 54 for forming a drain region 60. In this embodiment, the first conductive type is p-type and the source region 58 is implanted with p-type dopants while the second conductive type is n-type and the drain region 60 is implanted with n-type dopants. Nevertheless, it would also be desirable to reverse the order and/or conductive type of the first ion implantation process and second ion implantation process, such as by first implanting n-type dopants for forming a source region and then implanting p-type dopants for forming a drain region, which is also within the scope of the present invention.

Similar to the aforementioned embodiment, the source region 58, a channel region 62 or top portion 52 of fin-shaped structure 44 directly under the gate structure 54, and the drain region 60 are in a way made of three different materials after the source region 58 and the drain region 60 are formed. For instance, the source region 58 adjacent to one side of the gate structure 54 preferably includes Ge or SiGe with p-type dopants, the channel region 62 or top portion 52 of fin-shaped structure 44 directly under the gate structure 54 includes Ge or SiGe having no dopants, and the drain region 60 includes Ge or SiGe with n-type dopants.

Moreover, according to an embodiment of the present invention, the ratio of germanium to silicon (Ge/Si) could be adjusted to form a gradient channel from the source region 58, through the channel region 62 directly under the gate structure 54, and to the drain region 60. For instance, the Ge/Si ratio in this embodiment could be adjusted so that the Ge/Si ratio gradually decreases from the source region 58 to the drain region 60. By doing so, the band gap would be increased from the source region 58 to the drain region 60 which would further in turn suppress ambipolar issue so that better driving current could be obtained.

Figure 6:
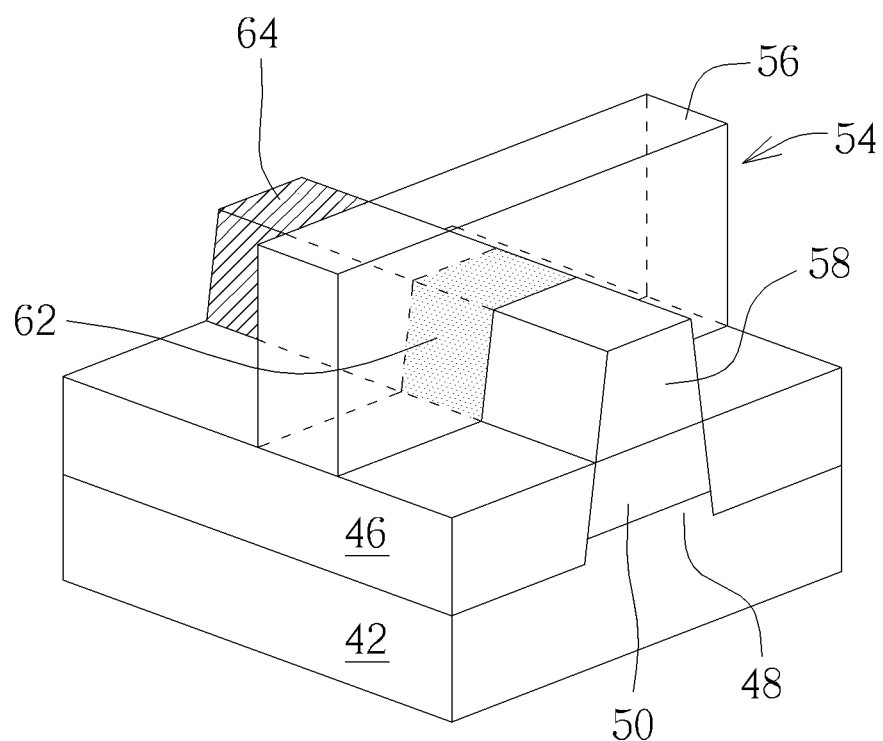
FIG. 6 illustrates a structural view of a TFET according to an embodiment of the present invention.

Referring to FIG. 6, FIG. 6 illustrates a structural view of a TFET according to an embodiment of the present invention. As shown in FIG. 6, after forming the source region 58 and drain region 60 having different conductive type as disclosed in FIG. 5, an etching process could be conducted to remove the drain region 60 made of Ge or SiGe on one side of the gate structure 54 and expose the middle portion 50 made of silicon oxide underneath, and then grow another epitaxial layer 64 with in-situ n-type dopants through epitaxial growth process on the exposed middle portion 50.

Preferably, the newly grown epitaxial layer 64 (or the new drain region) and the channel region 62 directly under the gate structure 54 are made of different material, and the new drain region 64 and the source region 58 are also made of different material. For instance, the new drain region 64 in this embodiment is preferably made of silicon or silicon carbide (SiC) with in-situ n-type dopants while the channel region 62 is made of Ge or SiGe and the source region 58 is made of Ge or SiGe with p-type dopants.

After forming the source region 58 and the drain region 60 or drain region 64, elements such as a CESL (not shown) and a ILD layer could be formed on source region 58, the drain region 64, and the gate structure 54, and a RMG process similar to the aforementioned embodiment could be conducted to transform the gate structure 54 into metal gate.

Figure 7:
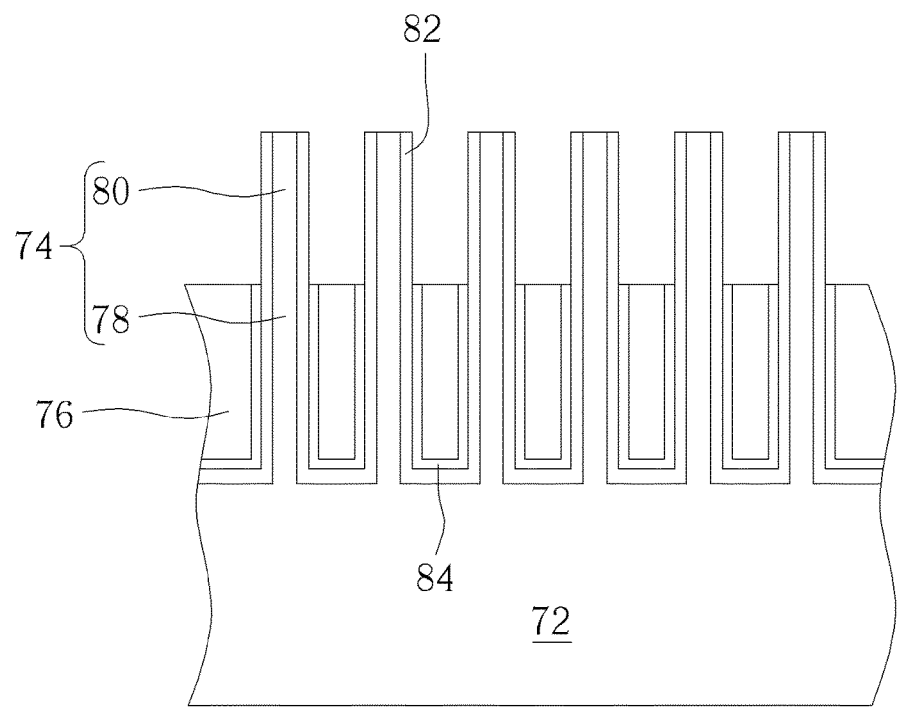
FIGS. 7-8 illustrate a method for fabricating a tunneling field effect transistor (TFET) according to an embodiment of the present invention.
Figure 8:
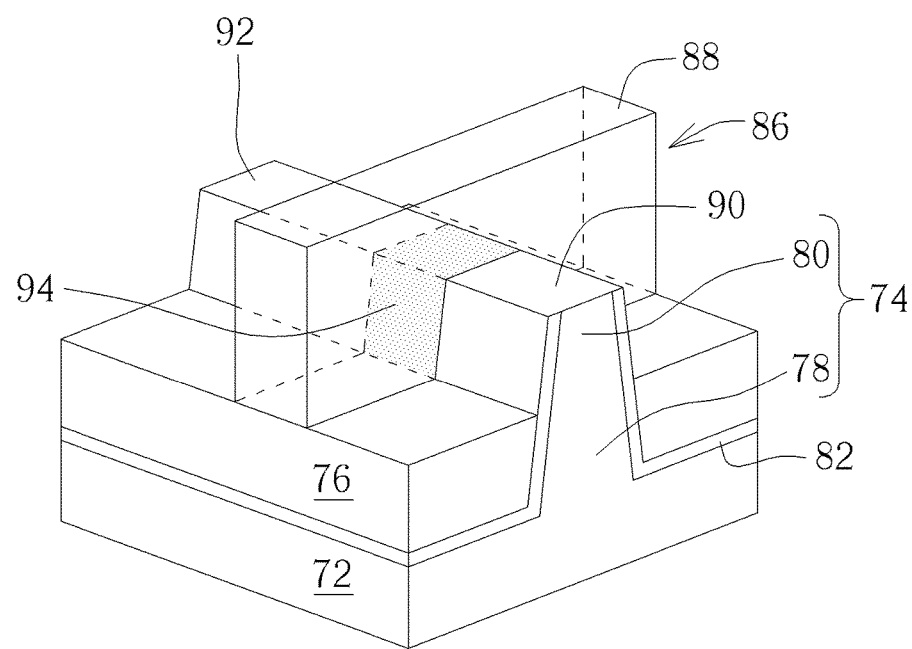

Referring to FIGS. 7-8, FIGS. 7-8 illustrate a method for fabricating a tunneling field effect transistor (TFET) according to an embodiment of the present invention. Preferably, FIG. 7 illustrates a cross-section view for fabricating a TFET and FIG. 8 illustrates a 3-dimensional view for fabricating the TFET following FIG. 7. As shown in FIGS. 7-8, a substrate 72, such as a silicon substrate or silicon-on-insulator (SOI) substrate is first provided, fin-shaped structures 74 are formed on the substrate 72, and a shallow trench isolation (STI) 76 composed of material such as silicon oxide is formed around the fin-shaped structures 74.

In this embodiment, each of the fin-shaped structures includes two portions 78, 80, in which the bottom portion 78 is embedded under a top surface of the STI 76 while the top portion 80 is protruding from the top surface of the STI 76. A cladded layer 82 is formed on the sidewalls of the fin-shaped structures 74 as well as on the top surface of the substrate 72, and an optional hard mask 84 is formed between the cladded layer 82 and the STI 76. Preferably, the top portion 80, the bottom portion 78, and the substrate 72 are made of same material such as silicon, the cladded layer 82 is made of epitaxial material including but not limited to for example, germanium (Ge) and/or silicon germanium (SiGe), and the hard mask 84 could be selected from the group consisting of silicon oxide, silicon nitride, silicon oxynitride, and silicon carbon nitride. It should be noted that the top portion 80 and cladded layer 82 protruding from the top surface of the STI 76 will be covered by a gate structure in the later process and will be serving as a channel region or channel layer of the device.

Next, as shown in FIG. 8, at least a gate structure 86 is formed on the substrate 72 and STI 76 and standing astride at least one of the fin-shaped structures 74. Similarly, only a single gate structure 86 disposed across a single fin-shaped structure 74 is shown in FIG. 8 for emphasizing the formation of source region and drain region with respect to the gate structure 86 in the later process. The fabrication of the gate structure 86 could be accomplished by a gate first process, a high-k first approach from gate last process, or a high-k last approach from gate last process. Since this embodiment pertains to a high-k last approach, dummy gate or gate structure 86 composed of an interfacial layer (not shown) and a patterned polysilicon material layer 88 could be first formed on the fin-shaped structure 74 and the STI 76, and a spacer (not shown) is formed on the sidewall of the gate structure 86.

Next, a first ion implantation process is conducted to implant dopants of a first conductive type into the top portion 80 of fin-shaped structure 74 on one side of the gate structure 86 for forming a source region 90. After that, a second ion implantation is conducted to implant dopants of a second conductive type into the top portion 74 on another side of the gate structure 86 for forming a drain region 92. In this embodiment, the first conductive type is p-type and the source region 90 is implanted with p-type dopants while the second conductive type is n-type and the drain region 92 is implanted with n-type dopants. Nevertheless, it would also be desirable to reverse the order and/or conductive type of the first ion implantation process and second ion implantation process, such as by first implanting n-type dopants for forming a source region and then implanting p-type dopants for forming a drain region, which is also within the scope of the present invention.

Similar to the aforementioned embodiment, the source region 90, a channel region 94 including the top portion 80 of fin-shaped structure 74 and part of the cladded layer 82 directly under the gate structure 86, and the drain region 92 are in a way made of three different materials after the source region 90 and the drain region 92 are formed. For instance, the source region 90 adjacent to one side of the gate structure 86 preferably includes Ge or SiGe with p-type dopants, the channel region 94 directly under the gate structure 86 includes a combination of silicon from the top portion 80 of fin-shaped structure 74 and Ge or SiGe having no dopants from the cladded layer 82, and the drain region 92 includes Ge or SiGe with n-type dopants.

Moreover, according to an embodiment of the present invention, the ratio of germanium to silicon (Ge/Si) could be adjusted to form a gradient channel from the source region 90, through the channel region 94 directly under the gate structure 86, and to the drain region 92. For instance, the Ge/Si ratio in this embodiment could be adjusted so that the Ge/Si ratio gradually decreases from the source region 90 to the drain region 92.

Figure 9:
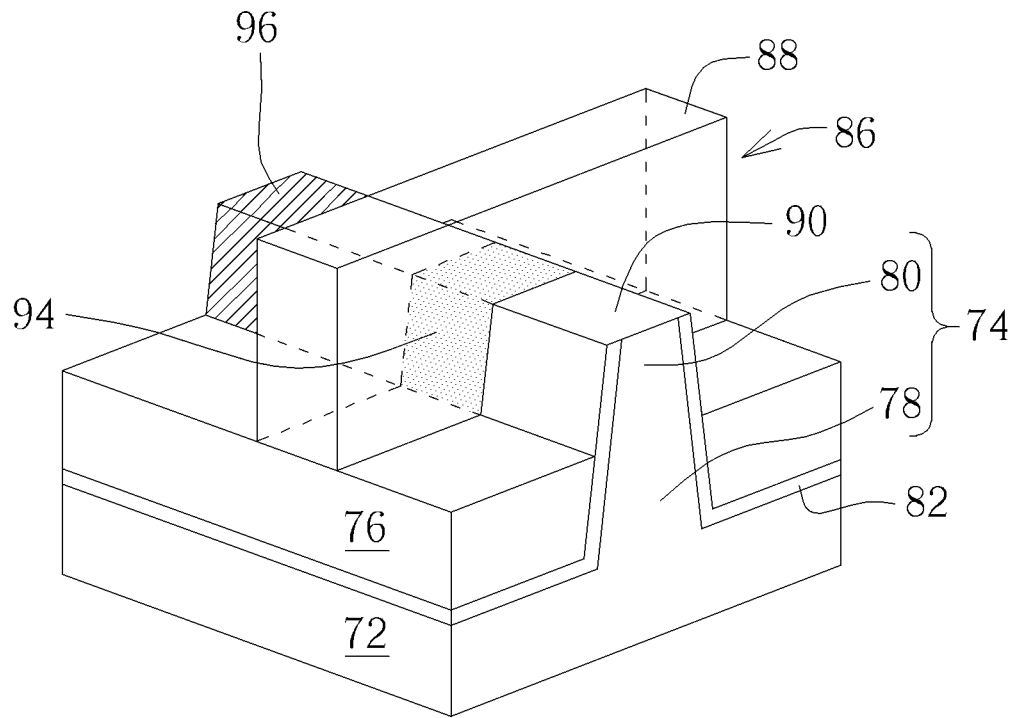
FIG. 9 illustrates a structural view of a TFET according to an embodiment of the present invention.

Referring to FIG. 9, FIG. 9 illustrates a structural view of a TFET according to an embodiment of the present invention. As shown in FIG. 9, after forming the source region 90 and drain region 92 having different conductive type as disclosed in FIG. 8, an etching process could be conducted to remove the drain region 92 made of Ge or SiGe on one side of the gate structure 86 and expose the cladded layer 82 and bottom portion 78 of fin-shaped structure 74 underneath, and then grow another epitaxial layer 96 with in-situ n-type dopants through epitaxial growth process on the exposed cladded layer 82 and bottom portion 78.

Preferably, the newly grown epitaxial layer 96 (or the new drain region) and the channel region 94 directly under the gate structure 86 are made of different material, and the new drain region 96 and the source region 90 are also made of different material. For instance, the new drain region 96 in this embodiment is preferably made of silicon or silicon carbide (SiC) with in-situ n-type dopants while the channel region 94 is made of a combination of silicon from the top portion 80 of fin-shaped structure 74 and Ge or SiGe having no dopants from the cladded layer 82, and the source region 90 is made of Ge or SiGe with p-type dopants.

After forming the source region 90 and the drain region 92 or drain region 96, elements such as a CESL (not shown) and a ILD layer could be formed on source region 90, the drain region 96, and the gate structure 86, and a RMG process similar to the aforementioned embodiment could be conducted to transform the gate structure 86 into metal gate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate;
   forming a fin-shaped structure on the substrate, wherein the fin-shaped structure comprises a top portion and a bottom portion;
   forming a first epitaxial layer on the sidewalls of the bottom portion and the substrate;
   forming a hard mask on the first epitaxial layer;
   forming a shallow trench isolation (STI) around the fin-shaped structure and on the hard mask, wherein the top portion is protruded from a top surface of the STI and the bottom portion is embedded under the top surface of the STI;
   forming a gate structure on the fin-shaped structure and the STI, wherein the fin-shaped structure directly under the gate structure comprises the first epitaxial layer;
   forming a source region in the fin-shaped structure adjacent to one side of the gate structure, wherein the source region comprises a first conductive type; and
   forming a first drain region in the fin-shaped structure adjacent to another side of the gate structure, wherein the first drain region comprises a second conductive type.

2. The method of claim 1, wherein the top portion and the bottom portion comprise different material.

3. The method of claim 1, further comprising:
   performing a first implant process to form the source region in the top portion of the fin-shaped structure adjacent to one side of the gate structure; and
   forming a second implant process to form the first drain region in the top portion of the fin-shaped structure adjacent to another side of the gate structure.

4. The method of claim 1, further comprising:
   removing the top portion of the fin-shaped structure adjacent to another side of the gate structure; and
   forming a second epitaxial layer adjacent to the another side of the gate structure for forming a second drain region.

5. The method of claim 4, wherein the first drain region and the second drain region comprise different material.

6. The method of claim 4, wherein the second drain region comprises silicon or silicon carbide.

7. The method of claim 4, wherein the second drain region and the fin-shaped structure directly under the gate structure comprise different material.

8. The method of claim 4, wherein the second drain region, the fin-shaped structure directly under the gate structure, and the source region comprise different material.

9. A semiconductor device, comprising:
a substrate;
a fin-shaped structure on the substrate;
a shallow trench isolation (STI) around the fin-shaped structure;
a gate structure on the fin-shaped structure and the STI, wherein the fin-shaped structure directly under the gate structure comprises a first epitaxial layer;
a source region adjacent to one side of the gate structure, wherein the source region comprises a first conductive type; and
a drain region adjacent to another side of the gate structure, wherein the drain region comprises a second conductive type and the drain region, the fin-shaped structure directly under the gate structure, and the source region comprise different material.

10. The semiconductor device of claim 9, wherein the fin-shaped structure comprises a top portion protruded from a top surface of the STI and a bottom portion embedded under the top surface of the STI.

11. The semiconductor device of claim 10, wherein the top portion and the bottom portion comprise different material.

12. The semiconductor device of claim 9, wherein the drain region comprises a second epitaxial layer.

13. The semiconductor device of claim 12, wherein the second epitaxial layer comprises silicon or silicon carbide.

14. The semiconductor device of claim 9, wherein the drain region and the fin-shaped structure directly under the gate structure comprise different material.

15. The semiconductor device of claim 9, wherein a germanium to silicon ratio is decreased from the source region to the drain region.

16. The semiconductor device of claim 9, further comprising a cladded layer on the fin-shaped structure directly under the gate structure.

17. The semiconductor device of claim 16, wherein the cladded layer comprises germanium or silicon germanium.

18. A semiconductor device, comprising:
a substrate;
a fin-shaped structure on the substrate;
a shallow trench isolation (STI) around the fin-shaped structure;
a gate structure on the fin-shaped structure and the STI, wherein the fin-shaped structure directly under the gate structure comprises a first epitaxial layer;
a source region adjacent to one side of the gate structure, wherein the source region comprises a first conductive type; and
a drain region adjacent to another side of the gate structure, wherein the drain region comprises a second conductive type and a germanium to silicon ratio is decreased from the source region to the drain region.

* * * * *